(12) United States Patent
Kapelke et al.

(10) Patent No.: US 11,063,524 B2
(45) Date of Patent: Jul. 13, 2021

(54) ELECTRICAL DEVICE HAVING A SEMICONDUCTOR CIRCUIT

(71) Applicant: SIEMENS ENERGY GLOBAL GMBH & CO. KG, Munich (DE)

(72) Inventors: Martin Kapelke, Nuremberg (DE); Manfred Suda, Hemhofen (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 0 days.

(21) Appl. No.: 16/091,566

(22) PCT Filed: Apr. 6, 2016

(86) PCT No.: PCT/EP2016/057519
§ 371 (c)(1),
(2) Date: Oct. 5, 2018

(87) PCT Pub. No.: WO2017/174126
PCT Pub. Date: Oct. 12, 2017

(65) Prior Publication Data
US 2019/0123658 A1    Apr. 25, 2019

(51) Int. Cl.
*H02M 7/00* (2006.01)
*H02M 7/155* (2006.01)
*H01L 25/11* (2006.01)
*H01L 25/16* (2006.01)
*H02J 3/36* (2006.01)

(52) U.S. Cl.
CPC .......... *H02M 7/003* (2013.01); *H01L 25/112* (2013.01); *H01L 25/165* (2013.01); *H02M 7/155* (2013.01); *H02J 3/36* (2013.01); *Y02E 60/60* (2013.01)

(58) Field of Classification Search
CPC ...... H02M 7/003; H02M 7/155; H01L 25/165
USPC .............................. 363/35, 68, 144; 361/600
See application file for complete search history.

(56) References Cited

U.S. PATENT DOCUMENTS

| | | | |
|---|---|---|---|
| 3,878,448 A | 4/1975 | Jackson et al. | |
| 4,218,731 A | 8/1980 | Kuehnel | |
| 4,816,980 A * | 3/1989 | Wiendl ................. | H01L 25/112 363/35 |
| 6,265,656 B1 | 7/2001 | Berth | |
| 2010/0078998 A1* | 4/2010 | Wei ....................... | H02M 5/458 307/31 |
| 2011/0174526 A1* | 7/2011 | Takematsu ............. | H01L 23/13 174/258 |

(Continued)

FOREIGN PATENT DOCUMENTS

| | | |
|---|---|---|
| DE | 19841134 A1 | 3/2000 |
| EP | 0299275 B1 | 3/1992 |

OTHER PUBLICATIONS

SMJ320C40, TMP320C40 Digital Signal Processors datasheet (Rev. H), Oct. 12, 2001. Texas Instrument. From https://www.ti.com/product/SMJ320040 (Year: 2001).*

*Primary Examiner* — Bryan R Perez
(74) *Attorney, Agent, or Firm* — Laurence Greenberg; Werner Stemer; Ralph Locher

(57) ABSTRACT

An electrical device with a semiconductor circuit that is configured for a high voltage and is arranged in a housing. The housing is formed of a plurality of housing parts which are electrically insulated from one another. Different electrical potentials can be assigned to the housing parts. There is also described an converter with the electrical device.

12 Claims, 3 Drawing Sheets

(56) References Cited

U.S. PATENT DOCUMENTS

2011/0305047 A1* 12/2011 Jungreis .................. H02M 1/08
363/21.02
2012/0120700 A1* 5/2012 Elberbaum ........... H02M 1/081
363/128
2015/0342076 A1* 11/2015 Dilley .................... H05K 7/026
361/730

* cited by examiner

ELECTRICAL DEVICE HAVING A SEMICONDUCTOR CIRCUIT

BACKGROUND OF THE INVENTION

Field of the Invention

The invention relates to an electrical device having a semiconductor circuit, which is designed for a high voltage and arranged in a housing.

Such a device is known from the prior art, in particular from high-voltage engineering. For example, converters for converting alternating voltage into DC voltage or vice versa have converter valves comprising a plurality of power semiconductors. The power semiconductors are semiconductor switches, which are designed for the high voltage range, in other words for voltage differences higher than 1 kV. The power semiconductors are usually accommodated in one or more housings.

EP 0 299 275 B1, for example, discloses a power converter, the converter valves of which comprise thyristors which are arranged in housings in the form of modules. The modules are grouped together into valve towers, which are mounted in a valve room. The valve room is at ground potential. In the operation of the power converter, by contrast, the thyristors of the semiconductor circuit are at different high-voltage potentials, so that the semiconductor circuit, or the parts thereof, must be electrically insulated from the housing or the housing wall of the module. This is usually achieved by the provision of sufficient distance between the semiconductor circuit or part thereof and the housing wall. When high voltages are present on the semiconductor circuit, this inevitably requires the dimensions of the housing to be large. Usually, the width and the length of the housing are up to several meters. This makes the necessary accessibility to perform installation and maintenance work on the semiconductor circuit very difficult.

SUMMARY OF THE INVENTION

The object of the invention is to propose an electrical device of equivalent type, which offers a possibility for simpler maintenance.

The object is achieved by the fact that the housing comprises a plurality of housing parts which are electrically insulated from each other, wherein different electrical potentials can be assigned to the housing parts.

In the operation of the electrical device according to the invention, different housing components can each be brought in particular to a different, previously specified electrical potential. In this case, the respective electrical potential of a part of the housing can be matched to the electrical potential of the components of the semiconductor circuit located physically closest thereto.

In this way, flexible voltage differences between the semiconductor circuit and the housing can be advantageously obtained. In particular, for example, a component of the semiconductor circuit or a semiconductor circuit part which is at the highest voltage level no longer needs to be insulated from an entire housing at ground potential or at the lowest potential of the semiconductor part, but only from a part of the housing at a given, higher (sub-)potential.

The insulating air paths between the semiconductor circuit and the housing can be advantageously reduced.

This reduces the maintenance effort considerably due to improved access to the semiconductor circuit.

Expediently, at least one housing part is at a high-voltage potential in operation. For a semiconductor circuit which is operated at a high voltage, this allows the insulation distances to be kept particularly low. If, for example, the semiconductor circuit consists of a plurality of components, of which one component is at a high-voltage potential, then the housing part which is physically closest to this component should be allocated to this high-voltage potential.

In semiconductor circuits which have particularly high voltage differences at their terminals, for example of more than 10 kV, it is considered advantageous if adjacent housing parts each have a potential difference of between 1 kV and 200 kV, or even higher, in operation. In this way, a gradation of the voltage levels of the housing parts can be achieved, which enables an adaptation to the voltage applied to the semiconductor circuit. By an appropriate allocation of the potentials to the housing parts according to their spatial arrangement with respect to the semiconductor circuit or its components, an especially compact design of the housing can be achieved.

According to one embodiment of the invention the housing is a module frame, on which the semiconductor circuit is mounted. Therefore, the housing does not necessarily need to have a structure that completely encloses the semiconductor circuit. Instead, it can be an advantage if the housing is designed as a module frame. The module frame surrounds the semiconductor circuit and provides a suitable suspension device, to which the semiconductor circuit can be attached. The module frame holds the semiconductor circuit at the sides, but it does not need to provide a complete covering of the semiconductor circuit from above and/or from below. The arrangement of the semiconductor circuit ensures both a good cooling effect as well as a particularly good level of accessibility to the semiconductor circuit.

The module frame preferably comprises a plurality of frame segments that are separated from each other by means of insulator components. The housing parts in the form of frame segments can be, for example, plate-shaped. To provide the insulation of the frame segments against themselves, the insulator components are provided between each pair of frame segments which are to be assigned different potentials. The insulator components are advantageously mounted on the frame segments and comprise electrically insulating spacers. This enables a particularly simple and effective distribution of the potentials over the housing.

According to one advantageous embodiment of the invention, the module frame has a C-shape. This means the module frame is designed such that in at least one spatial plane it resembles the letter C. To this end, the module frame has a one-sided indentation in this plane, which is at least partially bounded on three sides. A particular advantage of this embodiment is obtained, for example, when two of the electrical devices are arranged opposite each other, wherein the indentations of the C-shaped module frames of the two devices are facing each other. This means that a free space is formed between the two devices. This free space can be used advantageously to enable additional access for maintenance work on the semiconductor circuits. For example, a lifting platform can be provided, which is arranged in the free space and provides an appropriate accessibility for maintenance work.

According to a further embodiment of the invention, the semiconductor circuit has a series circuit of power semiconductors. Such a series circuit usually results in a voltage difference existing between the terminals of the series circuit in the operation of the electrical device. In high-voltage applications this voltage difference can be in the region of over 10 kV or even over 200 kV. This has the consequence that a first power semiconductor in the series circuit can be at a low potential, for example at ground potential, whereas a final power semiconductor in the series circuit can be at a high-voltage potential, for example of far in excess of 100 kV. In this case, the distribution of the potentials over the housing is particularly effective. The housing parts can be assigned graded voltage or potential levels, so that compact dimensions of the individual housing parts are feasible. The power semiconductor at the highest potential then does not need to be insulated from a housing at ground potential for the entire potential difference between ground potential and high-voltage potential.

A particularly favorable applicability of the invention is obtained if the semiconductor circuit comprises thyristors. For example, at least one of the power semiconductors of the series circuit can be a thyristor. Thyristors are often used in high-voltage converters, because these semiconductor switches can have a particularly high blocking capacity. The blocking capacity of the thyristors and/or the other power semiconductors in an advantageous application of the invention can be, for example, between 1 kV and 8 kV or more.

Advantageously, each thyristor in the series circuit is assigned an RC circuit and/or a valve choke. The RC circuit comprises a resistive element and a capacitor, which are suitably arranged in parallel with the thyristor. The RC circuit is arranged with each thyristor in the housing.

The invention further relates to a converter having an electrical device with a semiconductor circuit between an AC-voltage connection and a DC-voltage connection, which is designed for a high voltage and arranged in a housing.

Such a converter is known, for example from the previously cited document EP 0 299 275 B1. The known converter comprises thyristor modules which are mounted in the form of valve towers in a valve room. Each thyristor module comprises a plurality of thyristors, which form a series circuit.

The object of the invention is to propose a converter of equivalent type, which allows maintenance in the simplest possible way.

The object is achieved in a converter of equivalent type by the fact that the housing comprises a plurality of housing parts which are electrically insulated from each other, wherein different electrical potentials can be assigned to the housing parts.

For example, a series circuit consisting of power semiconductors can be at least partly accommodated in a module housing, which comprises a plurality of housing parts which are at different electrical potentials during the operation of the converter.

The advantages of the converter according to the invention are derived from the previously described advantages of the electrical device according to the invention.

It goes without saying that all previously described variants and embodiments of the electrical device according to the invention can be used in the converter according to the invention, either alone or in combination with each other.

In the following the invention is explained further on the basis of exemplary embodiments of the electrical device according to the invention and the converter according to the invention shown in FIGS. 1 and 2.

DESCRIPTION OF THE INVENTION

Figure 1:
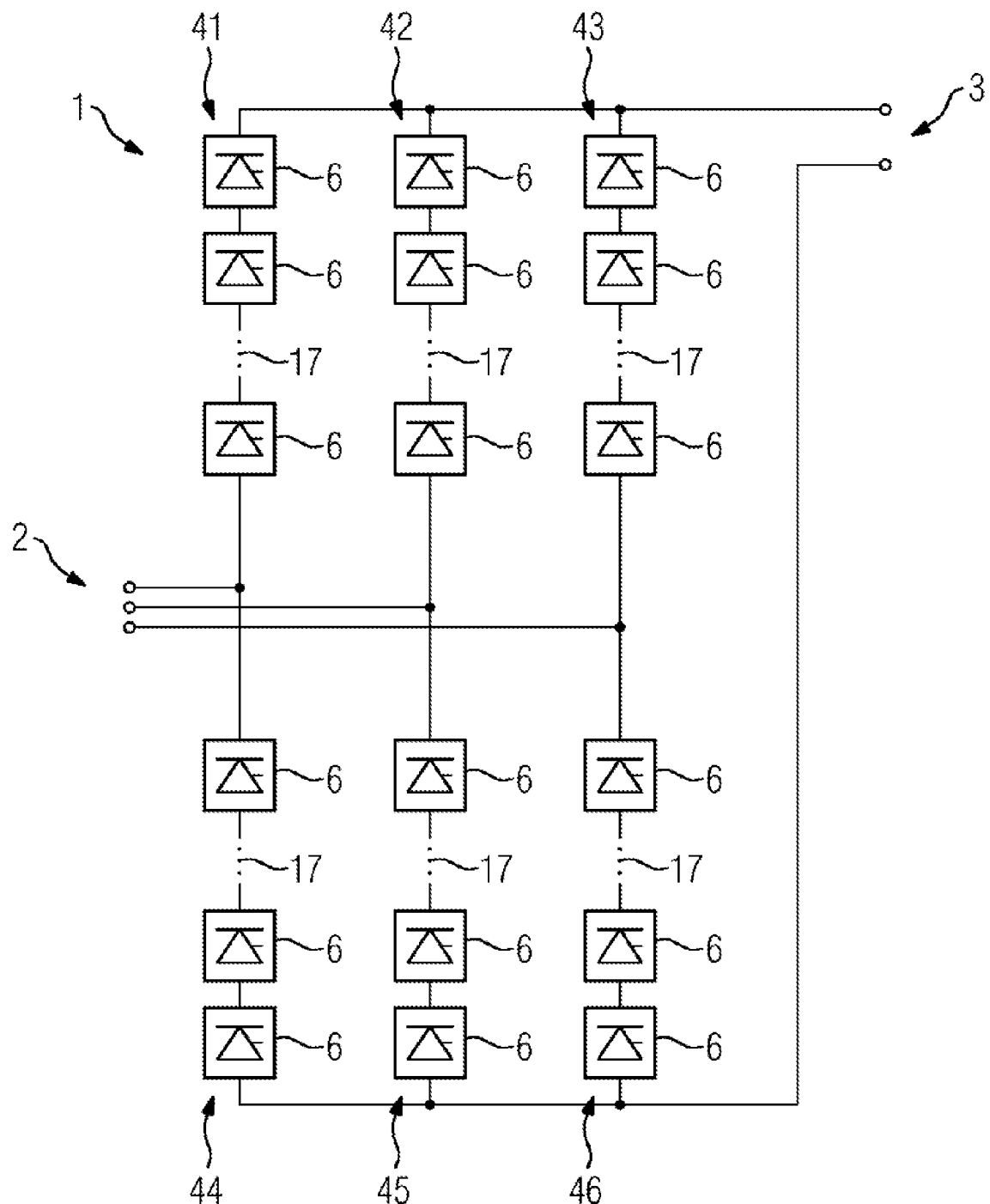
FIG. 1 shows an exemplary embodiment of a converter according to the invention in a schematic representation.

Specifically, FIG. 1 shows a converter 1. The converter 1 has an AC-voltage side with an AC-voltage connection 2 for connecting to a three-phase alternating voltage network. Furthermore, the converter 1 has a DC-voltage side with a DC-voltage connection 3 for connecting to a DC voltage line. The converter 1 comprises three phase branches, which are also designated as valve branches 41-46. Each of the valve branches 41-46 has a series circuit of thyristor modules 6. A broken line 17 in each valve branch 41-46 illustrates the fact that in the general case, more than the three thyristor modules explicitly shown can be arranged there.

Each thyristor module 6 is an electrical device with a series circuit consisting of a plurality of thyristors, which are arranged in a housing together with an associated thyristor circuit and valve chokes.

The structure of the thyristor module 6 will be discussed in more detail in the FIG. 2 following.

Figure 2:
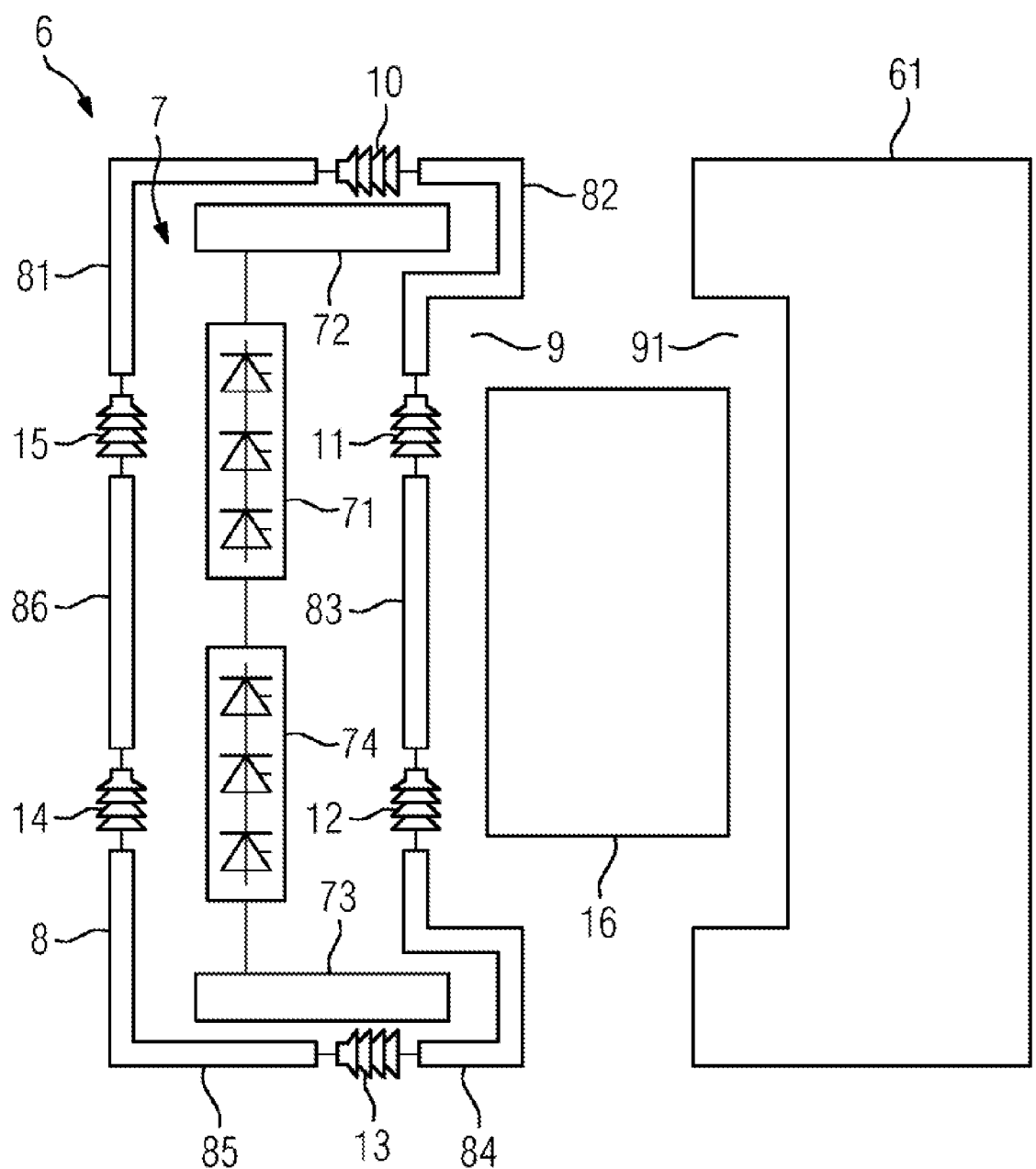
FIG. 2 shows an exemplary embodiment of an electrical device according to the invention in a schematic plan view.

FIG. 2 shows an electrical device in the form of a thyristor module 6. The thyristor module 6 comprises a semiconductor circuit 7, which comprises a first thyristor module 71, a second thyristor module 74 and an upper and a lower valve choke 72 or 73. The first and second thyristor module 71 or 74 each comprise a series circuit of thyristors and an associated thyristor circuit.

The semiconductor circuit 7 is arranged in a housing in the form of a module frame 8. The module frame 8 comprises a plurality of frame segments 81-86. The frame segments 81-86 are arranged around the semiconductor circuit 7 in such a way that they form a C-shape 9 with an indentation in the plane of the drawing of FIG. 2. In the exemplary embodiment shown in FIG. 2, the module frame 8 comprises six frame segments 81-86. In general, the number and size of these can be varied as desired and adjusted to suit the application and the design of the semiconductor circuit 7.

The frame segments 81-86 are electrically insulated from each other by means of insulating components in the form of insulating spacers 10-15. Due to the insulation, different electrical potentials can be assigned to each of the frame segments 81-86. This allows each frame segment 81-86 to have its own, pre-defined potential level in the operation of the thyristor module 6.

If, for example, the valve choke 73 is connected to a pole at a negative potential and the valve choke 72 is connected to a pole at a more positive potential than this, then the framework segment 81 can be assigned a higher potential than the framework segment 85. As a result, the insulation distances between the upper valve choke 72, or at least a part of the first thyristor module 71, and the frame segment 81 can be chosen to be relatively small. Similarly, the insulation distances between the lower valve choke 73, or at least a part of the second thyristor module 74, and the frame segment 85 can be chosen to be relatively small.

In the exemplary embodiment shown in FIG. 2 another thyristor module 61 is arranged facing the thyristor module 6. The thyristor module 6 and the other thyristor module 61 are designed in the same way, so that there is no need to further elaborate the design of the other thyristor module 61. The indentation 9 of the thyristor module 6 and an indentation 91 of the other thyristor module 61 are facing each other. In the free space formed by the two indentations 9, 91 a lifting platform 16 is arranged. The lifting platform 16 can be moved perpendicular to the drawing plane of FIG. 2. Thus, by means of the lifting platform 16 both the thyristor modules 6 and 61 as well as any thyristor modules arranged spatially above these, not shown in the drawing, can be reached. The accessibility of the thyristor modules and/or the semiconductor circuits for installation and maintenance purposes is therefore greatly improved.

Figure 3:
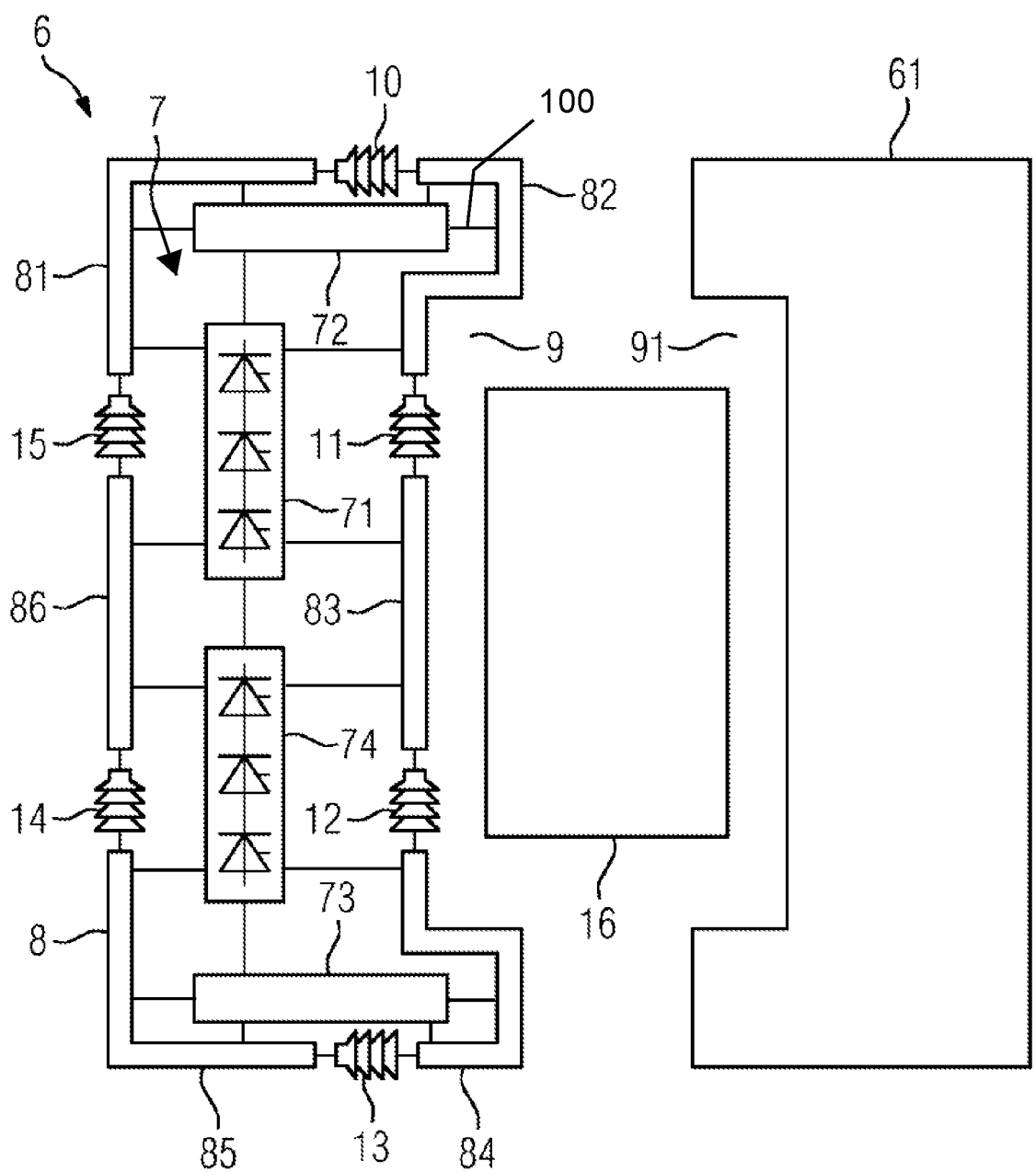
FIG. 3 shows another exemplary embodiment of an electrical device according to the invention in a schematic plan view.

FIG. 3 shows an embodiment in which the semiconductor circuit 7 is mounted on the module frame 8. The module frame 8 surrounds the semiconductor circuit 7 and provides a suitable suspension device 100, to which the semiconductor circuit 7 is attached.

The invention claimed is:

1. An electrical device, comprising:
   a housing composed of a module frame;
   a semiconductor circuit configured for high voltage arranged in said housing;
   said semiconductor circuit having at least two thyristor modules, an upper valve choke, and a lower valve choke;
   said at least two thyristor modules each having a series circuit of thyristors and an associated thyristor circuit;
   said module frame having a plurality of frame segments being electrically insulated from each other by insulating components in the form of insulating spacers, wherein different electrical potentials can be assigned to each of said frame segments to allow each frame segment to have a different pre-defined potential during operation of the thyristor module.

2. The electrical device according to claim 1, wherein said frame segments are arranged around the semiconductor circuit in such a way that they form a C-shape.

3. The electrical device according to claim 1, wherein said electrical device is a thyristor module.

4. An electrical device, comprising:
   a housing; and
   a semiconductor circuit configured for high voltage arranged in said housing;
   said housing being formed of a plurality of housing parts that are electrically insulated from one another, wherein different electrical potentials are assignable to said housing parts;
   wherein said housing is a module frame and said semiconductor circuit is mounted on said module frame; and
   wherein said semiconductor circuit comprises a plurality of power semiconductors connected in series.

5. The electrical device according to claim 4, wherein at least one of said power semiconductors is a thyristor.

6. The electrical device according to claim 5, further comprising a valve choke assigned to said thyristor.

7. The electrical device according to claim 4, wherein each of said power semiconductors has an electrical blocking capacity of at least 1 kV.

8. The electrical device according to claim 7, wherein said power semiconductors include thyristors and each thyristor is assigned a valve choke.

9. An electrical device, comprising:
   a housing; and
   a semiconductor circuit configured for high voltage arranged in said housing;
   said housing being formed of a plurality of housing parts that are electrically insulated from one another, wherein different electrical potentials are assignable to said housing parts;
   wherein said housing is a module frame and said semiconductor circuit is mounted on said module frame; and
   wherein said module frame comprises a plurality of frame segments that are isolated from one another by way of insulator components.

10. The electrical device according to claim 9, wherein at least one of said housing parts is at a high-voltage potential in operation.

11. The electrical device according to claim 9, wherein mutually adjacent housing parts have a potential difference between 1 kV and 200 kV in operation.

12. An electrical device, comprising:
    a housing; and
    a semiconductor circuit configured for high voltage arranged in said housing;
    said housing being formed of a plurality of housing parts that are electrically insulated from one another, wherein different electrical potentials are assignable to said housing parts;
    wherein said housing is a module frame and said semiconductor circuit is mounted on said module frame; and
    wherein said module frame is a C-shaped module frame.

* * * * *